United States Patent [19]

Peil

[11] 4,079,271

[45] Mar. 14, 1978

[54] ALARM DRIVER FOR A SMOKE DETECTOR

[75] Inventor: William Peil, North Syracuse, N.Y.

[73] Assignee: General Electric Company, Syracuse, N.Y.

[21] Appl. No.: 751,882

[22] Filed: Dec. 17, 1976

[51] Int. Cl.$^2$ ............................................. H03K 17/00
[52] U.S. Cl. .................................... 307/270; 307/255; 340/237 S
[58] Field of Search ................ 307/255, 270; 318/138, 318/294, 345, 439, 241; 323/75 E; 340/237 S

[56] References Cited

U.S. PATENT DOCUMENTS 3,538,353  11/1970  Hanger ................................... 307/255
3,770,986  11/1973  Prehle .................................... 307/270

Primary Examiner—Stanley D. Miller, Jr.
Assistant Examiner—B. P. Davis
Attorney, Agent, or Firm—Richard V. Lang; Carl W. Baker Baker; Frank L. Neuhauser

[57] ABSTRACT

An alarm driver is described providing an audio frequency signal for operating the alarm of a smoke detector. The driver comprises a four transistor bridge in which the transistor input bias is momentarily interrupted at an audio rate to permit the bridge current supplied to the alarm to stop and change direction. Cross coupling is provided to achieve bistability in operation of the bridge, while commutation is achieved by utilizing energy stored in the inductance of the alarm to turn one pair of transistors on and the other pair off at each switching transition. The driver is designed for maximum reliability and minimum current drain and it is suited for battery operation. It is preferably fabricated by an integrated circuit process, typically using bipolar transistors and sharing the substrate with the other circuitry of the smoke detector.

9 Claims, 3 Drawing Figures

ALARM DRIVER FOR A SMOKE DETECTOR

BACKGROUND OF THE INVENTION

1. Field of the Invention

The present invention relates to alarm systems which produce an audible signal and more particularly to electrical drivers used to operate such alarms.

2. Description of the Prior Art

The alarm system herein treated is designed for R8. in a smoke detector. A smoke detection cell and a circuit which monitors the condition of the smoke detection cell to produce an output voltage indicative of the smoke condition is described in the copending application of William Peil, Ser. No. 746,293, filed Dec. 1, 1976, entitled "Smoke Detector" and assigned to the Assignee of the present invention.

The foregoing monitor is designed for integrated circuit fabrication, using conventional bipolar transistor technology. The present arm driver is also designed for integrated circuit fabrication using conventional bipolar technology, and is suitable for integration on a common substrate with the monitor.

The present invention is for use in an alarm system which produces a loud sound to warn of a dangerous condition. It is designed for minimum energy consumption during operation or during stand-by. The most efficient sound producing mechanisms or alarms are ones which are designed for a limited range of frequencies. The frequencies should lie in the sonic range most audible to most individuals. Such an alarm may have a range of from 2,500 to 3000 hertz. In particular, wide range loud speakers are of low efficiency. The driver for such an alarm might take the form of an audio amplifier capable of faithfully reproducing an applied audio frequency signal. Such a design tends to be electrically inefficient, both in stand-by and under operating conditions. A second approach is to use a bridge type inverter to convert d.c. energy to a.c. energy at the desired frequency. While the conventional inverter is frequently designed for relatively high efficiency, it is normally not designed for the high reliability essential to alarm systems. Conventional driver circuits, unless certain measures are undertaken, stress the component transistors during switching and greatly limit their life expectancy. In addition, known inverters are rarely designed for the extremely low, microampere stand-by currents that are essential for reasonable life in battery operated systems.

SUMMARY OF THE INVENTION

It is an object of the present invention to provide an improved driver for operating an alarm.

It is a further object of the present invention to provide a driver for a smoke detector alarm which is of improved reliability.

It is another object of the present invention to provide a driver for a smoke detector alarm which is efficient in its use of electrical energy in both standby and operating conditions.

It is still another object to provide a driver for a smoke detector alarm which is of low current drain and suitable for battery operation.

It is yet another object of the invention to provide a driver for a smoke detector alarm which is suitable for integrated circuit fabrication.

These and other objects of the invention are achieved in a novel combination comprising a four terminal, four transistor bridge designed to be connected to a first and a second terminal of a d.c. source, and to a first and a second terminal of a load, the load having appreciable inductive energy storage. The transistor bridge consists of four transistors connected between the four terminals which are poled to conduct current in one direction from the source through the load when one diagonal (odd) pair of transistors are conducting and in the reverse direction when the other diagonal (even) pair of transistors are conducting. The combination further comprises: biasing means to provide a momentarily interrupted forward bias, which when interrupted, stops transistor conduction; cross coupling means for sustaining stable conduction in either the odd pair of transistors or the even pair of transistors during forward bias; and commutation means responding to the release of inductive energy stored in the load when conduction is interrupted, to turn on the previously nonconductive transistor pair when bias is resumed.

Assuming that the bridge transistors are numbered from one to four, with the first and second or "upper" transistors being connected to the ungrounded source terminal, and the third and fourth or "lower" transistors being connected to the ground source terminal, the cross coupling means comprises a fifth and a sixth transistor. The fifth transistor is of the same conductivity type as the third transistor and has its input junction connected in parallel with it and its collector coupled to the base of the second transistor and the base of said sixth transistor. By these connections, conduction of the fifth transistor is accompanied by conduction in the third transistor and non-conduction in the second and sixth transistors. The sixth transistor is similar to the fifth transistor in connection and in purpose. Conduction in the sixth transistor is accompanied by conduction in the fourth transistor, non-conduction in the first and in the fifth transistors.

In accordance with another facet of the invention, the commutation means comprises a conductive connection between the second load terminal and the base of the sixth transistor for coupling a conduction inducing inductive voltage surge to the sixth transistor and a conduction inhibiting inductive voltage surge to the fifth transistor upon interruption of conduction in the third transistor. A similar conductive connection is provided between the first load terminal and the base of the fifth transistor. It supplies a conductive inducing inductive voltage surge to the fifth transistor and a conduction inhibiting inductive voltage surge to the sixth transistor upon interruption of conduction in the fourth transistor.

The commutation means further comprises a first surge conducting semiconductor junction coupled between the second load terminal and the first source terminal. It is poled to be normally back-biased, and to permit inductive current flowing in the third transistor to continue to flow through the first source terminal in a source charging direction after interruption of conduction. A second surge conducting semiconductor junction is provided similar to the first in connection and in purpose. These junctions increase the electrical efficiency of the driver by returning current to the source when the surge exceeds the source potential.

In accordance with another aspect of the invention, the first surge conducting junction is the input junction of a seventh transistor, whose collector is coupled to the base of the second transistor so that its collector current flow due to the surge aids in turning on the second transistor. Similarly, the second surge conducting junction is also the input junction of an eighth transistor similar in connection and purpose to the seventh transistor.

In its preferred form, the alarm driver is of integrated circuit fabrication with all transistors fabricated on a single substrate which is connected to the second source terminal. When this mode of fabrication is employed, a first junction is present between the collector of the fourth transistor and the substrate which permits inductive current flow in the first transistor to continue to flow through the second source terminal in a source charging direction after interruption of conduction. A similar second junction is also present between the collector of the third transistor and the substrate which permits inductive current flowing in the second transistor to continue to flow through the second terminal in a source charging direction after the interruption of conduction. These substrate junctions increase the electrical efficiency of the driver by returning current to the source when the surge exceeds the source potential.

The biasing means comprises a ninth and a 10th buffer transistor for providing momentarily interrupted forward bias to the third, fourth, fifth and sixth transistors. A two state control signal, one state of which is momentary, is jointly coupled to the ninth and tenth transistors. The output of the ninth transistor is separately coupled to the bases of the third and fifth transistors, and the output of the 10th transistor is separately coupled to the bases of said fourth and sixth transistors. The momentary signal state is selected to turn off any of the third, fourth, fifth or sixth transistors that are conducting while the other signal state is selected to sustain conduction of any of the third, fourth, fifth and sixth transistors that are conducting after commutation and cross coupling.

The biasing means further comprises: an 11th and a 12th current source transistor for providing momentarily interrupted forward bias to the first and second transistors. A second, two state control signal, one state of which is momentary, is supplied jointly to the 11th and 12th transistors, the two control signals being in synchronism. The current of the eleventh transistor is separately coupled to the base of the second transistor and the current of the 12th transistor is separately coupled to the base of the first transistor so that the momentary signal state turns off either of said first and second transistors that are conducting; while the other signal state sustains conduction of either of either of the first and second transistors that are conducting after commutation and cross coupling.

For further energy conservation, first resistance is provided, inserted between the first transistor and the first source terminal for providing a first voltage drop when the odd transistor pair are conducting. A second resistance is also provided inserted between the second transistor and the first source terminal for providing a second voltage drop when the even transistor pair is conducting. The first voltage drop is coupled to the eleventh current source transistor in a sense to reduce its conduction and conduction in the even transistor pair when the odd transistor pair is conducting. The second voltage drop is coupled to the 12th current source transistor in a sense to reduce its conduction and conduction in the odd transistor pair when the even transistor pair is conducting.

BRIEF DESCRIPTION OF THE DRAWING

The novel and distinctive features of the invention are set forth in the claims appended to the present invention. The invention itself, however, together with further objects and advantages thereof may best be understood by reference to the following description and accompanying drawings, in which:

DESCRIPTION OF THE PREFERRED EMBODIMENTS

Figure 1:
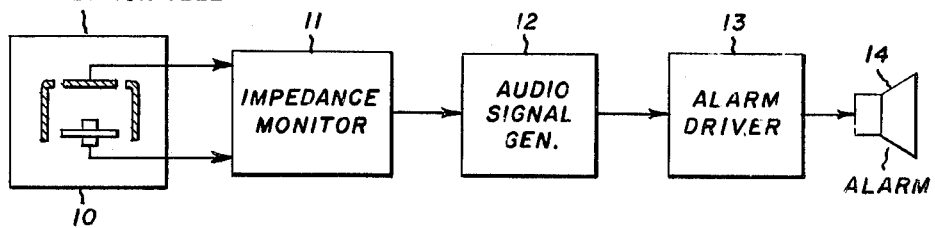
FIG. 1 is a block diagram showing the principal elements of a smoke detector including an audio signal generator, an alarm, and a novel alarm driver, which is the subject of the present invention.

FIG. 1 is a block diagram showing the principal elements of a smoke detector. The smoke detector is an electrical network comprising an ionization type smoke detection cell 10, an impedance monitor 11, an audio signal generator 12, an alarm driver 13, and an alarm or horn 14. When suitably electrically energized, the detection cell exhibits an increase in impedance in the presence of smoke. The impedance monitor 11 is coupled to the detection cell and senses any changes in impedance of the detection cell in the presence of smoke. If the impedance has increased beyong a specified limit, indicating a given dangerous smoke condition, the impedance monitor, which is coupled to the audio oscillator 12, produces a near zero output voltage. If the impedance is in the normal lower impedance state, indicating an absence of smoke, the output is several volts positive at about the supply voltage. The audio oscillator 12 turns on in response to a falling output voltage, and generates a variable frequency audio signal, which is coupled to the alarm driver 13. The alarm driver, under the control of the audio oscillator, generates a high power, variable frequency audio signal, and powers the alarm 14 which reproduces it.

Figure 3:
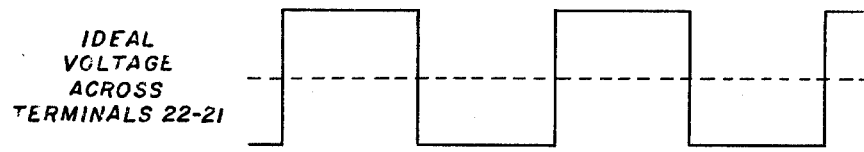
Figure 3:
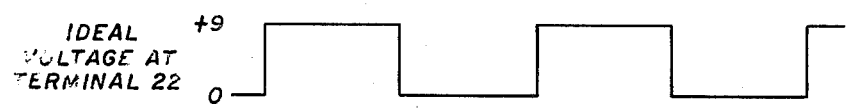
Figure 3:
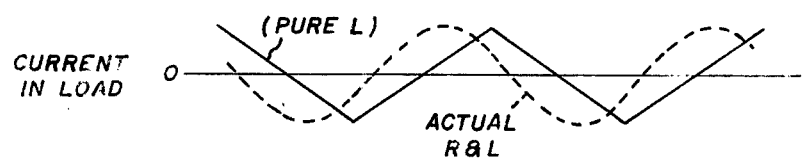
Figure 3:
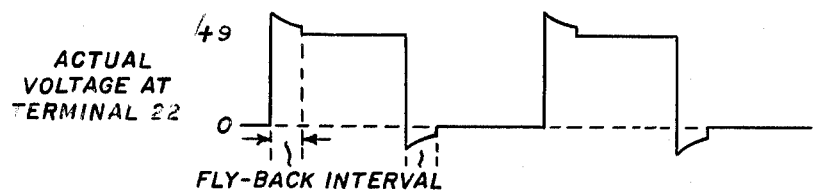
Figure 3:
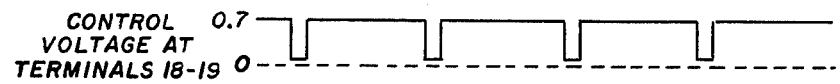
Figure 3:

FIG. 3 illustrates the electrical circuit of the audio signal generator 12 and the alarm driver 13. As noted above, the audio signal generator is voltage responsive. When turned on by the occurrence of a falling voltage, the generator produces an electrical control signal of audio frequency which varies at several cycles per second between two frequencies in the region of 3000 hertz (i.e., 2400 to 2900 hertz). This frequency characteristic is selected for its attention getting ability. The output of the audio oscillator is coupled to the control terminals of the alarm driver 13. The alarm driver generates a high power, variable frequency signal having the frequency characteristic of the oscillator control signal and couples the high powered signal to the alarm 14. Audible signal levels are designed to be in the vicinity of 90 decibels.

The audio signal generator is composed of a voltage controlled oscillator operating at the higher frequency mentioned above, a lower frequency voltage controlled oscillator whose alternating output voltage is used to vary the frequency of the higher frequency oscillator, an input control circuit for turning the two oscillators on or off in accordance with the smoke condition, and an output circuit coupled to the alarm driver.

The higher frequency voltage controlled oscillator (VCO) includes the transistors Q5, Q6, Q7, diode D4, capacitor C2 and resistors R1, R2 and and R3. The NPN transistors Q5 and Q7, which are interconnected in two feedback paths, are the active elements of the oscillator. The base of Q5 is coupled to one terminal of an adjustable capacitor C2, whose other terminal is grounded. The capacitor C2, which is recurrently charged and discharged in operation of the oscillator, has its base connected terminal coupled through constant current source Q26 to the B+ bus 15. The current in Q26 is referenced to a primary current reference comprising a diode connected transistor D1, whose junction shunts the input junction of Q26 and whose cathode is returned to ground through a large valued resistance R4. In the first feedback connection, the emitter of transistor Q5 is coupled to the emitter of transistor Q6. Both emitters are coupled through serially connected resistances R3, R2, R1, and switching transistor Q3 to ground. In the second feedback connection, the collector of Q5 is coupled through diode D4 to the base of transistor Q6. The collector of Q6, from which one oscillator output is derived, is coupled for d.c. energization to alarm driver terminal 16, which is coupled via diode D5 and resistance 10 to the B+ bus 15. Collector current to Q5 and base current to Q6 is provided from the base of PNP transistor Q7, whose emitter is coupled through serially connected resistors R5 and R6 to the B+ bus 15. Transistor Q7 and Q5 act as a dynamic load resistance of approximately 30,000 ohms to the oscillator. The collector of transistor Q7, from which another oscillator output is derived for controlling the driver, is returned to ground through collector load resistance R7. The voltage control point for adjusting the oscillator frequency is the interconnection of R5 to R6.

The Q5, Q6 voltage controlled oscillator oscillates in the following manner. Let us assume that switching transistor Q3 is conducting, that capacitor C2 is discharged, that transistor Q5 is non-conducting, and that transistor Q6 is conducting. The voltage at the emitter of Q6 is somewhat in excess of two junction drops (Q7, Q6) below the B+ bias voltage. The emitter of transistor Q5 is joined to the emitter of Q6 and shares the same large positive potential. The base of transistor Q5 is near ground potential, assuming C2 to be discharged. Thus, transistor Q6 is strongly back-biased and off. As capacitor C2 charges toward B+ potential, a threshold is crossed at which the base of Q5 goes positive in respect to its emitter, and conduction in transistor Q5 ensues. Conduction by Q5 due to the voltage division ratio between the collector connected resistors (R5 × Beta and R6) and emitter connected resistors (R1, R2, R3), causes the voltage at the collector of Q5 to fall toward ground potential, taking with it the base and emitter of Q6. As the emitter of Q6 goes negative, the emitter of Q5 goes more negative, increasing its forward bias and initiating the regenerative action. Transistor Q5 is rapidly turned on fully and saturates. In saturation, transistor Q5, whose collector to emitter potential is near zero, reduces the forward bias on transistor Q6 to a small value established by the voltage drop across diode D4 and reduces its conduction to near turn off. With Q5 turned on, and Q6 nearly off, capacitor C2 is discharged through the input junction of Q5, resistances R3, R2 and R1 (and Q3). As the capacitor C2 becomes almost fully discharged and the discharging rate slows, the reactive ($dv/dt$) current into the base of Q5 is no longer sufficient to maintain the collector of Q5 in saturation, and the collector of Q6 to go positive. When this occurs, the forward bias to Q6 is increased, and Q6 begins to conduct more strongly. As Q6 continues to conduct, its emitter voltage climbs toward B+ turning off Q5. The base of Q5 is left at near ground potential and is slowly recharged toward B+ by the current source Q26, and the process is repeated.

Latch-up may occur in the discharged state of C2 is parameter variations are too great and if the current in the current source Q26 times the Beta of Q5 is greater than the B+ bias divided by the dynamic resistance (Beta Q7 × R5). To overcome the latch-up problem, the diode D4 is added in the collector path of Q6 which prevents Q6 from being fully turned off. At the low point of the cycle, the network is unstable and will continue past, and swing back up to the high point of the cycle. This insures that the network will remain oscillatory in spite of a wide variation in the Betas of the concerned transistors.

The Q5, Q6 circuit forms a voltage controlled oscillator whose frequency is set by the supply voltage and the capacitor (C2) charging time constants. Assuming a fixed charging rate if oscillator load (Q7, R5) is returned to a voltage other than B+, then the charge of C2 will take longer or shorter, before the base voltage of Q5 goes positive with respect to its emitter. This is because the emitter voltage of Q5 is directly determined by the voltage on the base of Q6, less than the voltage drop of the input portion of Q6, and the voltage on the base of Q6 less the voltage drop of the input junction of Q2, is determined by the voltage at the terminals of the resistor R5. Assuming that the voltage is reduced at the connection of R5 to R6, the frequency of oscillation will increase. The oscillator frequency is approximately inversely proportional to the size of capacitor C2, and directly proportional to the charge current (B+voltage divided by R4/4). The discharge rate is not instantaneous but has only a small affect on the frequency. It is inversely proportional to the size of the capacitor of C2 and directly proportional to the sum of the resistances (R3, R2, R1) in the emitter path. Using the indicated parameters, the frequency is in the vicinity of 3,000 hertz.

The low frequency oscillator, which is used to vary the frequency of the high frequency oscillator is also a voltage controlled oscillator. It includes the "hook" connected PNP, NPN transistor pair Q12, Q13, the capacitor C3, the current source 27 and resistances R4, R9 (and R1). The emitter of transistor Q12 is coupled through the current source Q27 to the B+ bus 15. The input junction of the current source is connected in parallel with the diode D1 which serves as its primary current reference. The capacitor C3 is led through resistance R8, forward biased diode D5 and resistance R10 to the B+ bus 15. The collector of PNP transistor Q12 is coupled to the base of NPN transistor Q13. The collector of Q13 is returned to the base of Q12 to complete the "hook" feedback connection. The emitter of Q13 is led through R9, Q4 and switching transistor Q3 to ground.

The low frequency VCO (Q12, Q13) oscillates in the following manner. Let us assume that capacitor C3 has maximum charge (the electrode connected to the emitter of Q12 is substantially below B+). Under these conditions, the base of Q12 is about one diode drop (D5) below B+, and transistor Q12 is back biased and off. The current source Q27 discharges C3 at a controlled rate. As discharge of C3 continues, the emitter voltage of Q12 becomes forward biased, turning Q12 on. The "hook" connection between Q12 and transistor Q13 is regenerative, and both transistors quickly saturate. Capacitor C3 is charged through Q12, the input junction of Q13, and R9 toward ground, a process which also increases the current in resistance 8. At some point, the reactive $dv/dt$ charging current in C1 becomes small enough so that saturation can no longer exist. This condition occurs when the current in the emitter of Q12 (which is transferred through a saturated Q12 collector to the base of Q13) times the Beta of Q13 is less than the current in R8. The current in the current source (Q27) is normally 1/6 microamperes and R8 is 1000 ohms, allowing a maximum current flow of approximately 1 milliampere. The oscillation is therefore stable and latch-up unlikely unless the Beta of Q13 exceeds $10^3/1/6 \times 10^{-6}$ or 6000. The maximum nominal Beta of Q13 is 600, so a latch-up condition is unlikely. As before, the voltage applied to the oscillator (at R8) can be varied to change the oscillator frequency. This adjustment is not needed and the resistance R8 is coupled to a point near B+ potential.

The low frequency oscillator (Q12, Q13) varies the frequency of the high frequency oscillator (Q5, Q6) by varying its bias voltage. The variation in bias voltage for Q5, Q6 is achieved by a compound amplifier, consisting of the NPN, PNP transistors Q11 and Q10. The compound amplifier is functionally similar of an emitter follower, but may be provided with some voltage gain. The input of the "compound" is the base of NPN transistor Q11 which is connected to the floating terminal of the capacitor C3. The emitter of Q11 is coupled to a tap on resistance R6 in the collector load of PNP transistor Q10. This connection provides some gain. (For unity gain the emitter of Q11 would be returned to the collector of Q10.) The collector of Q11 is returned to the base of Q10. The emitter of Q10 is grounded, and the collector of Q10 which serves as the output of the compound is coupled to the terminal of the high frequency oscillator load resistance R5 connected to R6. Accordingly, the compound Q10, Q11 transfers the variation in voltage occurring across capacitor C3, with a larger than unity transformation, to the load of the high frequency oscillator, and thus causes the frequency of the high frequency oscillator to be swept in proportion to that voltage. With indicated circuit values, the oscillator frequency varies between 2400 and 2900 hertz, with the variation occurring at a rate of several cycles per second.

Both the high frequency VFO (Q5, Q6) and the low frequency VFO (Q12, Q13) are actuated by an input control circuit in response to the output voltage of the impedance monitor 11. The oscillator control circuit comprises the diodes D2, D3 and transistors Q1, Q2, Q3, Q4 and Q25, and R1, R2. The capacitor C1, illustrated as a portion of the impedance monitor 11 is the component at which the smoke dependent voltage appears. The voltage on the capacitor C1 assumes a near B+ voltage when smoke is not present, and a near zero voltage when smoke is present and an alarm is to be sounded. The ungrounded capacitor terminal is coupled to the base of emitter follower PNP transistor Q1. The collector of Q1 is grounded, and the emitter, whose voltage follows the voltage on C1, is coupled through diode D3 to the input base of the transistor compound amplifier Q2, Q3. The emitter of Q1 is coupled to the cathode of diode D3. The anode of diode D3 is coupled through current source Q25 to the B+ bus 15. The current source Q25 is referenced to the primary current source (D1,R4). The anode of D3 is also coupled to the base of PNP transistor Q2 which together with NPN transistor Q3 forms a compound transistor amplifier similar to (Q11, Q10). The compound Q2, Q3 functions like an emitter follower with some voltage gain. The collector of Q2 is coupled to the base of NPN transistor Q3. The emitter of Q2 is coupled to the interconnection of R2 and R3 in the emitter paths of Q5, Q6. A diode D2 is provided having its anode coupled to the base of Q2 and its cathode coupled to the emitter of Q2. The emitter of Q3 is grounded and its collector is coupled to the terminal of R1 remote from R2. The resistors R1, R2 and R3 in the collector of Q3 have values selected to give the compound Q2, Q3 a voltage gain of about 2 in transfer of the voltage on the capacitor C1 to the collector of Q3 while the serial junctions (Q1, D3, Q2) produce a deadband of about 1½ volts in the oscillator control function.

The control circuit of the audio frequency generator functions in the following manner to turn on the oscillator. If the capacitor C1 is fully charged to approximately the B+ bias potential, the input junctions of Q1, D3 and Q2 are back-biased and non-conductive. With Q2 non-conductive, Q3, the second member of the compound, is also non-conductive, and both the high frequency oscillator (Q5, Q6) and the low frequency oscillator (Q12, Q13), which derive their current through Q3, are inactive. As the voltage on the capacitor falls to about 1½ volts below B+, the junctions of Q1, D3 and Q2 become forward biased and conduction in Q2 and Q3 ensues. Conduction in Q2 activates the high frequency oscillator (Q5, Q6) and initiates the periodic discharge of the capacitor C2. At an intermediate point (typically, 4 or 5 volts on the capacitor C1), the voltage drop across R1 turns on Q4 and the low frequency oscillator (Q12, Q13) is turned on. As the capacitor C1 continues to discharge, it approaches a minimum value of about 1½ volts, at which voltage the collector of Q3 is driven into full saturation and produces a near zero potential for the audio oscillator. The ability of Q3 to saturate despite the dead band (due to the serial Q1, D3, Q2 junction drop) is attributable to the gain of the transistor compound (Q2, Q3). The saturation of Q3 and the return of the series resistor (R1, R2, R3) to ground ensures a discharge of capacitor C2 to a maximum extent and prevents other variables in the turn-on amplifier (Q1, D3, Q2, D2) from affecting the operating frequency of the VFO (Q5, Q6) of the audio frequency generator.

The turn-off process repeats the turn-on process in reverse. With the oscillator on, the capacitor C1 may reach a stable value of about 1½ volts above ground with a discharge current of approximately 1/12 microampere. When the smoke condition has cleared, the impedance monitor then provides a current in excess of this requirement. This excess of charging current over discharging current causes the voltage on capacitor C1 to climb through mid B+ bias voltage. At this point the transistor Q4 turns off, and the low frequency modulation due to (Q12, Q13) is suspended. As the voltage on C1 climbs to about 1½ volts below B+, both the compound (Q2, Q3) and the high frequency oscillator (Q5, Q6) are turned off.

The output circuit of the audio frequency generator provides a pair of output signals for activation of the driver and for control of its output frequency. In the absence of signals from the generator, the driver draws essentially no current, and is quiescent. When the generator output signals are present and coupled to the driver, the driver is activated and produces a square wave output. The output circuit of the generator includes the transistors Q6, Q7, Q8 and Q9. The two generator output signals are coupled respectively to the driver terminals 16 and 17, 18. The first output signal, which appears at the collector of oscillator transistor Q6, is coupled to terminal 16 of the alarm driver. It takes the form of a momentary current interruption with a 5 to 10% duty cycle. It occurs at the instant that Q5 turns on fully and turns off Q6. This event occurs at the variable frequency of the oscillator (Q5, Q6). The current interruption in Q6, as will be explained, interrupts conduction of the PNP current sources Q22, Q23 which effects a partial control over conduction in the upper stages of the driver. A second audio oscillator output is derived from the collector of transistor Q7. The transistor Q7 is the dynamic load of oscillator transistor Q5, and has its base connected to the base of Q6. Transistor Q7 is also turned on fully at the instant that Q5 turns on fully. Thus, a pulse of collector current in Q7 is produced synchronous with the interruption of current in Q6. The current pulse from transistor Q7 develops a voltage in load resistance R7, which is coupled between the bases of transistors Q8 and Q9 and their emitters, which are grounded. The pulse turns on Q8 and Q9, which are normally off, and carries their collectors, which are coupled to driver control terminals 17 and 18, into saturation and to a near zero voltage. In short, the signal at the collectors of NPN transistors Q8 and Q9 takes the form of a negative going voltage pulse of variable frequency with a 5 to 10% duty cycle poled to interrupt the conduction of NPN transistors Q16, Q17, Q18, Q19. The two oscillator control signals provide complete control over conduciton in the driver. The manner in which these control signals interrupt the output current and control the frequency of the alarm driver will be treated after a description of the driver circuitry.

The alarm driver provides a rectangular a.c. waveform at the frequency of the audio oscillator for powering the alarm 14. The alarm driver includes a four branch bridge including power transistors Q14, Q15, Q16, Q17 and control circuitry including transistors Q18, Q19, Q20, Q21, Q22, Q23, diode D5 and resistances R10 through R16 which control the operation of the power bridge.

Figure 2:
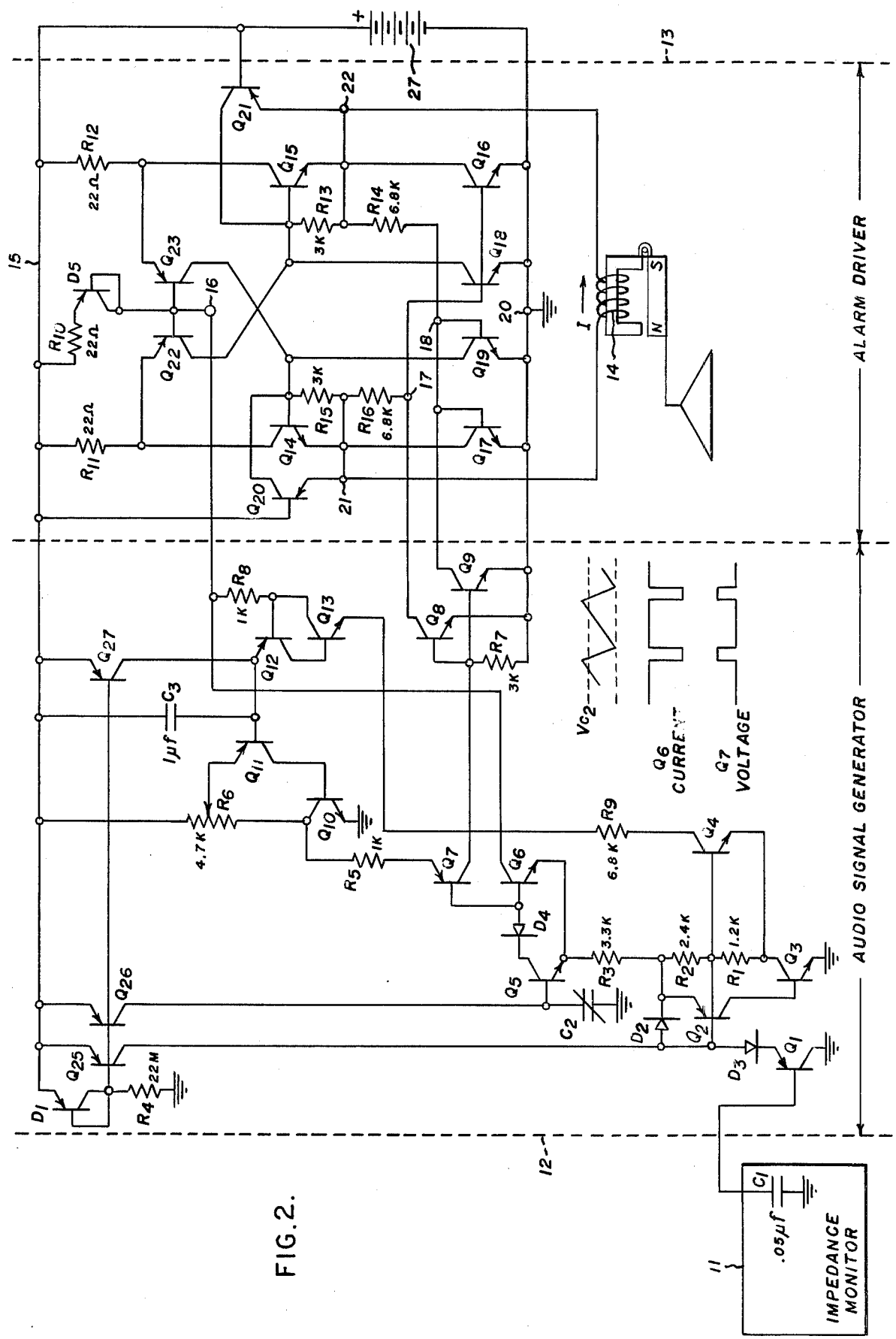
FIG. 2 is an electrical circuit diagram of the audio signal generator and the alarm driver, and FIG. 3 are wave shapes useful in explaining the operation of the alarm driver.

The two terminals of the transistor bridge are coupled to the bias supply for power input and two of the terminals are coupled to the alarm 14 which is the load to which power is supplied. In FIG. 2, the d.c. power is introduced into the transistor bridges at the d.c. input terminals (15, 20). The d.c. input terminals are coupled respectively to the B+ bus and the ground bus. A d.c. bias source 27, which is conventionally a battery of about 9 volts, has its positive terminal connected to the B+ terminal 15 and its negative terminal connected to the ground terminal 20. A.C. power is extracted from the transistor bridge by the alarm (or horn) 14 coupled between the bridge output terminals 21 and 22.

The branches of the transistor bridge are connected as follows. The first branch of the bridge, which is connected between the B+ terminal 15 and bridge a.c. output terminal 21, consists of the resistor R11 and transistor Q14 in series. The resistor 11 has one terminal connected to the B+ terminal and the other terminal to the collector of transistor Q14. The emitter of transistor Q14 is coupled to the bridge a.c output terminal 21. The third branch of the bridge is diagonal to the first branch and designed to be simultaneously conductive with it in a serial current path including the alarm 14. The third branch consists of the transistor Q16. The collector of Q16 is connected to the bridge a.c. output terminal 22 and its emitter is coupled to the ground terminal 20. The second branch of the bridge consists of serially connected resistance R12 and transistor Q15 connected between bridge terminal 15 and a.c. output terminal 22. Resistance R12 has one terminal connected to the terminal 15 and the other terminal connected to the collector of transistor Q15. The emitter of transistor Q15 is coupled to the bridge a.c. output terminal 22. The fourth branch of the bridge is diagonal to the second branch and designed to be simultaneously conductive with it in a serial current path including the alarm 14. The fourth branch consists of the transistor Q17 which has its collector coupled to the bridge a.c. output terminal 21 and its emitter coupled to the ground terminal 20. Bridge branches one and three thus form a first serial pair and bridge branches two and four form a second serial pair.

Assuming a proper control sequence, the bridge delivers a rectangular a.c. waveform to the alarm 14 connected to the a.c. output terminals of 21, 22. Assuming that the first serial pair of branches (Q14 and Q16) are conducting, and that the second serial pair of branches (Q15 and Q17) are not conducting, current will flow from source 27 into B+ terminal 15 through resistance R11, transistor Q14, terminal 21, and into the left terminal of alarm 14 (as seen in FIG. 2). After flowing through the alarm from left to right, the current continues from the right terminal of the alarm to the bridge terminal 22, through transistor Q16 and enters the ground terminal 20 completing the first current path. Assuming that the first serial pair of branches (Q14 and Q16) are not conducting, and that the second serial pair of branches (Q15 and Q17) are conducting, the current path will now include in sequence the B+ terminal 15, resistance R12, transistor Q15, the bridge terminal 22, the right alarm terminal. After flowing through the alarm from right to left, the current continues from the left alarm terminal to the bridge terminal 21, the transistor Q17 and the ground terminal 20, completing the second current path. In the first sequence, in which the first serial pair of branches are conducting, the current in the alarm flows from left to right, while in the second sequence in which the second serial pair of branches are conducting, the current in the alarm reverses and goes from right to left.

The control circuit, as will now be described, is designed to cause the power transistors in the branches of the bridge to conduct in the manner outlined above and to do so with minimum power losses, maximum efficiency and reliability.

The control circuit includes biasing means to provide a momentarily interrupted forward bias to the power transistors, cross coupling means for sustaining stable conduction in either the odd or even pair of power transistors during forward bias, and commutation means responding to inductive energy stored in the load, and released when conduction is interrupted to turn on the previously non-conductive transistor pair when bias is resumed. With reference to FIG. 2, the interrupted biasing means include the means associated with bridge control terminals 16 and 17, 18. The biasing means includes the transistors Q6, the current supply transistors Q22, Q23, diode D5, resistors R10, R11 and R12 associated with the control terminal 16. The biasing means also includes the transistors Q7, Q8, Q9 associated with the control terminals 17 and 18. The cross coupling means primarily include the partial flip-flop comprising control transistors Q18, Q19, resistors R13, R14, R15 and R16. The commutation means include the inductive load 14, the transistors Q20, Q21 and certain other circuit elements.

Taking up the cross coupling means first, the partial flip-flop comprising driver control transistors Q18, Q19 restricts the stable states of the bridge to the two states of conduction noted above. The NPN control transistor Q18 is coupled to control terminal 17 and its emitter is grounded. Its input junction is connected in parallel with the input junction of the power transistor Q16. The collector of control transistor Q18 is directly coupled to the base of power transistor Q15, through resistor R13 to the emitter of transistor Q15 (also bridge load terminal 22), and through a second resistor R14 to the base of control transistor Q19 in a cross coupling connection.

The natural consequence of these connections to driver control transistor Q18 is as follows. Should control transistor Q18 conduct, then power transistor Q16 (third branch), whose input junction parallels transistor Q18, should also conduct (to some degree); power transistor Q15 (second branch), should turn off; driver control transistor Q19 should turn off, and power transistor Q17 (fourth branch), whose input junction parallels control transistor Q19 should turn off. Finally, with Q18 conducting and Q19 off, power transistor Q14 (first branch) will not be inhibited — and may conduct.

The NPN driver control transistor Q19 forms the second half of the partial flip-flop, and functions analogously to the first driver control transistor (Q18). The base of oscillator control transistor Q19 is coupled to bridge control terminal 18 and its emitter is grounded. Its input junction is connected in parallel with the input junction of power transistor Q17. The collector of control transistor Q19 is directly coupled to the base of power transistor Q14; through resistor R15 to the emitter of transistor Q14 (also bridge load terminal 21); and through a second resistor R16 to the base of control transistor Q18 in a cross coupling connection.

The natural consequence of these connections to control transistor Q19 is as follows. Should control transistor Q19 conduct, then power transistor Q17 (fourth branch), whose input junction parallels transistor Q19, will also conduct (to some degree); power transistor Q14 (first branch), should turn off; driver control transistor Q18 should turn off, and power transistor Q16 (third branch) whose input junction parallels control transistor Q18, should turn off. Finally, with Q19 conducting, and Q18 off, power transistor Q15 (second branch) will not be inhibited, and may conduct.

In the stable bias period after each switching interval, the on signals from Q8, Q9 is applied to both control transistors Q18 and Q19 at the same time. Assuming that Q18 is already on when this happens, Q18 has adequate gain in the cross coupling connection to keep Q19 off and to prevent it from coming on. Similarly, if Q19 is already on, when the on signal comes back on, Q19 has adequate gain in the cross coupling connection to keep Q18 off and to prevent it from coming on.

The biasing means provides a forward bias to the power transistors which is momentarily interrupted to permit a reversal of current in the load. The first control voltage derived from Q8 and Q9 is applied to the control terminals 17 and 18 of the bridge, where its immediate effect is upon the lower power transistors Q16, Q17 and control transistors Q18, Q19. As previously noted, the control voltage permits conduction in all transistors Q16, Q17, Q18 and Q19 coupled to it during its on period, does not prevent cross coupling from keeping one pair on and the other off, and prevents conduction in any of the four transistors during its momentary off period. As the control voltage through 17, 19 goes to its off condition, as will be shown, it momentarily interrupts the current path between load and source, and initiates the commutation process.

The second portion of the bias means comprises transistors Q22, Q23, diode D5, resistors R10, R11 and R12 which respond to the second control signal derived from Q6 and coupled to the control terminal 16 of the bridge. The control terminal 16 is coupled to the bases of both current source transistors Q22, Q23. The emitters of both current source transistors are coupled respectively through resistances R10 and R12 to the B+ terminal 15. A primary current reference R10, D5 shunts the input junction of Q22, Q23 and provides a 1 to 1 current reference. The collector of transistor Q22 is coupled to the base of power transistor Q15 and to the collector of driver control transistor Q18 and thus supplies base current to the power transistor Q15 and collector current to the driver control transistor Q18. The collector of Q23 is coupled to the base of power transistor Q14, and to the collector of driver control transistor Q19 and thus supplies base current to the power transistor Q14 and collector current to the driver control transistor Q19.

The second control signal at 16 thus acts upon the current source transistors Q22 and Q23 and the upper power transistors Q14 and Q15. As previously noted, the control signal permits conduction in all transistors Q22, Q23, Q14, Q15 during its on period, does not prevent some reduction in current in the quiescent current source (as will be explained), and prevents conduction in any of these four transistors during the momentary off period. As the control voltage at terminal 16 goes to its off condition, it interrupts the current path between load and source, but more slowly than occurs in the lower rank, and facilitates the commutation process.

The final element in the driver control circuit is the commutation means, a part of which includes the transistors Q20 and Q21. The emitter of transistor Q20 is coupled to the driver output terminal 21, the base to the B+ bias terminal 15, and the collector to the base of power transistor Q14. The emitter of transistor Q21 is coupled to the driver output terminal 22, the base to the B+ bias terminal 15, and the collector to the base of power transistor Q16. The remainder of the commutation means comprises the load 14, whose inductance supplies the energy to achieve commutation, and the elements of the network previously described which channel this energy into the control network, to turn on the previously non-conductive pair and turn off the previously conductive transistor pair.

Commutation can best be understood by treating the driver circuit as an entity. In principle, commutation is achieved by energy storage in the highly inductive load 14. The biasing means momentarily interrupts conduction in the power transistors of the driver, and during this momentary interruption, the energy stored in the load, which has a sense dependent on the prior state of conduction, is used to precondition the power transistors that were previously off to be turned on, and the power transistors that were previously on, to be turned off.

A more detailed description of this function will now be undertaken with resort to the wave shapes of FIG. 3. The uppermost wave shape is an idealized view of the output voltage as it would appear across the output terminals 21 and 22. It is a rectangular a.c. waveform in which the polarity reverses from positive to negative with a peak to peak amplitude approximately equal to the B+ bias. The periodicity is shown to be constant, but in fact the circuit produces an almost continuously varying period. The ideal voltage at terminal 22 with respect to ground is shown immediately below. Here the waveform is also a square wave, but varies between B+ and ground. The current waveform, assuming a purely inductive load, is shown below in a solid line. It is a triangular wave, having equal upward and downward slopes and lags the voltage waveform by ninety degrees. A practical output current waveform containing the resistive component is shown superimposed over the ideal current waveform in a dotted line. It is more nearly sinusoidal and lags the voltage waveform by more nearly 30°. The remainder of the waveforms of FIG. 3 will be referred to as the discussion proceeds.

The commutation operation will now be described assuming that power transistors Q14 and Q16 are on, and that the load current (I) is increasing from left to right. The voltage (V) at terminal 22 is at near ground potential since Q16 is conducting. Commutation starts to occur when Q7 is turned on, Q8 and Q9 saturate, turning off the forward bias on driver control terminals 17 and 18. This causes power transistor Q16 to be turned off. The inductive component in the load now becomes a source instead of a load and causes the voltage on terminal 22 to go positive and in fact more positive than B+ as shown in FIG. 3. The amount that B+ is exceeded by one diode drop, the input junction of Q21, which functions as a first "catch" diode, conducts the generator current that was flowing in Q16. The current transfer from Q16 to the input diode of Q21 is very short in terms of the L-R time constant of the load.

If power transistor Q14 is now turned off, the voltage at terminal 21, previously at near B+ potential, will fall toward ground as the left terminal of the inductive load, acting as a generator, continues to demand current to replace that previously flowing in Q14. The current demand creates a catch diode D17 in the form of the collector to substrate diode of power transistor Q17. This diode, which is present in an integrated circuit, conducts current as the voltage transient at terminal 21 falls below ground potential by an amount in excess of the diode drop. (If an integrated circuit is not used, a separate diode would be provided.) Again it is assumed that the transfer from Q14 to catch diode D17 conduction is short in terms of the L-R time constant of the load. The current path to and from the current generating load is completed with the appearance of the two catch diodes, and current will continue to flow back into the power supply for a short period as illustrated in FIG. 3. The current will decrease to zero, and will then build up in the opposite direction eventually decaying in a damped fashion. If prior to reversal of fly-back current, the diagonal pair of power transistors (Q15 and Q17) are turned on, the voltage on terminal 22 will remain at slightly above B+ potential and that at terminal 21 will remain at slightly below zero potential. Except for the short duration transient, the voltage reversal is complete and current in the load can now fall to zero and then build up in the new direction. The cyclical reversals can be repeated indefinitely.

The turning on of the diagonal pair of power transistors that were previously off (Q15, Q17) assumed above, is due to "pre-conditioning" produced by the energy stored in the load. When the terminal 22 goes positive as a result of current generation in the load, the voltage is applied through resistance 14 to the base of driver control transistor Q19. The fly-back voltage turns on Q19, and partly turns on power transistor Q17. The turn off control signal from Q6 to the driver control terminal 16 is simultaneous with that to terminals 18, 19, but the current sources Q22 and Q23 are slow acting, laterally formed PNPs. Accordingly, it is only after Q16 has been turned off, and Q19 turned on, that the current sources act to aid in turning off power transistor Q14. Thus, both control transistor Q19 and current source Q23 act in turning off Q14. Control transistor Q19, still energized by the fly-back voltage, also applies a turn-off potential to the control transistor Q18. The pre-conditioning is essentially complete when a portion of the fly-back current flowing through the input junction of fly-back transistor Q21 flows through the collector of Q21 into the base of Q15. Assuming that Q22 and Q23 are both off, producing a corresponding off bias to Q14 and Q15, the fly-back current turns on power transistor Q15. Thus, while the biasing means provides "off" signals at 16 and 17, 18 to all four power transistors, the energy stored in the inductance of the load turns on power transistor Q17 and the companion control transistor Q19 by voltage fly-back. It also turns on the power transistor Q15 by "current" fly-back during the short fly-back period. The "catch" diodes (Q20, Q21, D16, D17) in particular, permit the "negative" or generated current to flow from the load which pre-conditions the driver for the next current direction. If the control signals are turned back on before the fly-back energy has been dissipated, and the pre-conditioning gone, conduction will be re-established in the new direction, and the commutation process will be complete.

The driver circuit is particularly efficient in its use of battery current. A substantial part of the energy derived from the battery in the form of current and converted to energy in the magnetic field is reconverted to current as the field collapses and that current is injected into the battery in a charging sense. Most batteries will accept such current transients, whose effect is to reduce the average current drain. A second effect that enters directly into the efficiency of the circuit arises in connection with the current sources Q22 and Q23. As noted above, both current sources are adjusted by resistors (R11, R12) to mirror a 1 to 1 current equal to that in the primary current reference diode D5, R10. When one diagonal pair of power transistors has in fact been turned on (e.g. Q15, Q17) and the other off (Q14, Q16), a current flow in resistor R12 develops a few hundred millivolts in a sense to reduce conduction in the unused current source (Q23). The active current source (Q22) is in partial saturation supplying primarily the current needed to keep Q15 in conduction.

In general, power efficiency of the driver is extremely good by virtue of the fact that simultaneous conduction of the "totem pole" transistors in the bridge (Q14, Q17, and Q15, Q16) is prevented. The suspension of forward base drive in the control signals to all power transistors during the switch over period partly prevents simultaneous conduction from occurring. The second preventive factor is that the fly-back potential acts unambiguously to turn on the proper serial pair of power transistors. In the event that an upper member of the totem (e.g. Q14) is slow in turning off, the control transistor (e.g. Q19) associated with the lower member (Q17) of the totem which is coming on applies the necessary turn off potential to the upper member before conduction is fully instituted below. The square wave nature of the drive is in keeping with a theoretical efficiency of 100% and the loss from this ideal is only one diode drop in 9 volts.

The driver has been designed for minimum leakage current during stand-by operation. Total stand-by current of the complete system is only 5 microamperes (5 × $10^{-6}$ amps), and all power transistors that have voltage applied (e.g. Q14, Q15) during stand-by have resistors (R13, R15) shunting their input junctions to prevent Beta current multiplication. The other transistors to which voltage is applied (Q22, Q23) have a diode D5 from base to emitter which prevents the leakage from being multiplied by more than 2.

The circuit is designed for economical assembly consistent with extreme reliability and low current drain. The circuit does not require an additional energy storage element - such as a comparator for use in the commutation processs, but rather uses the inductance of the alarm. The circuit design is readily carried out using integrated circuitry of the conventional bipolar form.

What is claimed as new and desired to be secured by Letters Patent of the United States is:

1. The combination, comprising:
   1. a first and a second terminal for connection to a d.c. source,
   2. a load having a first and a second terminal, and having appreciable inductive energy storage,
   3. a four terminal, four transistor bridge having
      a. the first transistor coupled between said first source terminal and said first load terminal,
      b. the second transistor coupled between said first source terminal and said second load terminal,
      c. the third transistor coupled between said second load terminal and said second source terminal, and
      d. the fourth transistor coupled between said first load terminal and said second source terminal,
      said transistors being poled to conduct current in one direction from said source through said load when the odd transistors are conducting and in the reverse direction when the even transistors are conducting,
   4. biasing means coupled to said transistors to provide a momentarily interrupted forward bias, which upon interruption, stops transistor conduction,
   5. cross coupling means coupled to said transistors for sustaining stable conduction in either the odd pair of transistors or the even pair of transistors during forward bias, and
   6. commutation means coupled to said transistors, responding to inductive energy stored in said load, and released when said conduction is interrupted, to turn on the previously non-conductive transistor pair when said bias is resumed.

2. The combination as set forth in claim 1, wherein said cross coupling means comprises a fifth and a sixth transistor;
   a. said fifth transistor being of the same conductivity type as said third transistor and having its input junction connected in parallel therewith and its collector coupled to the base of said second transistor and the base of said sixth transistor, to cause conduction in said fifth transistor to be accompanied by conduction in said third transistor and non-conduction in said second transistor and non-conduction in said sixth transistor,
   b. said sixth transistor being of the same conductivity type as said fourth transistor and having its input junction connected in parallel therewith and its collector coupled to the base of said fifth transistor, to cause conduction in said sixth transistor to be accompanied by conduction in said fourth transistor, non-conduction in said first transistor and non-conduction in said fifth transistor.

3. The combination as set forth in claim 2 wherein said commutation means comprises:
   a. a conductive connection between said second load terminal and the base of said sixth transistor for coupling a conduction inducing inductive voltage surge to said sixth transistor and a conduction inhibiting inductive voltage surge to said fifth transistor, upon interruption of conduction in said third transistor, and
   b. a conductive connection between said first load terminal and the base of said fifth transistor for coupling a conduction inducing inductive voltage surge to said fifth transistor and a conduction inhibiting inductive voltage surge to said sixth transistor upon interruption of conduction in said fourth transistor.

4. The combination set forth in claim 3, wherein said commutation means comprises:
   a. a first surge conducting semiconductor junction coupled between said second load terminal and said first source terminal, poled to be normally back-biased, and to permit inductive current flowing in said third transistor to continue to flow through said first source terminal in a source charging direction after said interruption, and
   b. a second surge conducting semiconductor junction coupled between said first load terminal and said first source terminal, poled to be normally back-biased, and to permit inductive current flowing in said fourth transistor to continue to flow through said first source terminal in a current source charging direction after said interruption,
   said junctions increasing efficiency by returning current to the source when said surge exceeds said source potential.

5. The combination set forth in claim 4, wherein:
   a. said first surge conducting junction is the input junction of a seventh transistor, whose collector is coupled to the base of said second transistor, current flow due to said surge aiding in turning on said second transistor, and wherein
   b. said second surge conducting junction is the input junction of an eighth transistor whose collector is coupled to the base of said first transistor, current flow due to said surge aiding in turning on said first transistor.

6. The combination set forth in claim 5 wherein:
   a. said eight transistors are fabricated by an integrated circuit process on a common substrate which is connected to said second source terminal, and wherein
   b. a first junction exists between the collector of said fourth transistor and said substrate, which permits inductive current flowing in said first transistor to continue to flow through said second source terminal in a source charging direction after said interruption, and c. a second junction exists between the collector of said third transistor and said substrate, which permits inductive current flowing in said second transistor to continue to flow through said second terminal in a source charging direction after said interruption, said last recited junctions increasing efficiency by returning current to the source when said surge exceeds said source potential.

7. The combination set forth in claim 6 wherein said biasing means comprises:
a. a ninth and a 10th transistor for providing momentarily interrupted forward bias to said third, fourth, fifth and sixth transistors,
b. means for supplying a two state control signal, one state of which is momentary, jointly to said ninth and tenth transistors,
c. means for separately coupling the output of said ninth transistor to the bases of said third and fifth transistors, and the output of said 10th transistor to the bases of said fourth and sixth transistors, said momentary signal state turning off any of said third, fourth, fifth or sixth transistors that are conducting, said other signal state sustaining conduction of any of said third, fourth, fifth and sixth transistors that are conducting after commutation and cross coupling.

8. The combination set forth in claim 7 wherein said biasing means comprises:
a. an 11th and a 12th current source transistor for providing momentarily interrupted forward bias to said first and second transistors,
b. means for supplying a second, two state control signal, one state of which is momentary, jointly to said 11th and 12th transistors, said two control signals being in synchronism,
c. means for separately coupling the current of said 11th transistor to the base of said second transistor and the current of said 12th transistor to the base of said first transistor, said momentary signal state turning off either of said first and second transistors that are conducting; said other signal state sustaining conduction of either of said first and second transistors that are conducting after commutation and cross coupling.

9. The combination set forth in claim 8 wherein:
a. a first resistance is provided inserted between said first transistor and said first source terminal, for providing a first voltage drop when said odd transistor pair are conducting,
b. a second resistance is provided inserted between said second transistor and said first source terminal for providing a second voltage drop when said even transistor pair is conducting,
c. means for coupling said first voltage drop to said eleventh current source transistor in a sense to reduce conduction therein, and in said even transistor pair,
d. means for coupling said second voltage drop to said 12th current source transistor in a sense to reduce conduction therein and in said odd transistor pair.

* * * * *